United States Patent
Kamiyama et al.

(10) Patent No.: US 6,324,200 B1
(45) Date of Patent: Nov. 27, 2001

(54) SEMICONDUCTOR LASER DEVICE

(75) Inventors: Satoshi Kamiyama, Hyogo; Masahiro Kume, Shiga; Ryoko Miyanaga, Nara; Isao Kidoguchi, Hyogo; Yuzaburo Ban, Osaka; Ayumu Tsujimura, Osaka; Yoshiaki Hasegawa, Osaka; Akihiko Ishibashi, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/294,336

(22) Filed: Apr. 20, 1999

(30) Foreign Application Priority Data

Apr. 22, 1998 (JP) .................................. 10-111932

(51) Int. Cl.[7] ..................................................... H01S 3/19
(52) U.S. Cl. ................................. 372/45; 372/43; 372/50
(58) Field of Search .............................. 372/43, 44, 45, 372/46, 47, 50

(56) References Cited

U.S. PATENT DOCUMENTS

| | | | |
|---|---|---|---|
| 5,231,102 | 7/1993 | Baker et al. ........................ | 514/312 |
| 5,811,839 | * 9/1998 | Shimoyama et al. .............. | 372/45 X |
| 5,932,896 | * 8/2000 | Sugiura et al. .................... | 372/45 X |
| 5,970,080 | * 10/1999 | Hata .................................. | 372/45 |
| 5,972,730 | * 10/1999 | Saito et al. ........................ | 372/45 X |
| 5,987,048 | * 11/1999 | Ishikawa et al. ................... | 372/46 |
| 5,990,496 | * 11/1999 | Kunisato et al. ................. | 372/45 X |
| 6,051,847 | * 4/2000 | Oku et a. .......................... | 372/45 X |
| 6,081,540 | * 6/2000 | Nakatsu ............................. | 372/45 |
| 6,100,544 | * 8/2000 | Lin et al. ........................... | 372/45 X |
| 6,100,546 | * 8/2000 | Major et al. ...................... | 372/45 X |

FOREIGN PATENT DOCUMENTS

| | | | |
|---|---|---|---|
| 0395392 A3 | 10/1990 | (EP) | ................................... 372/45 X |
| 0487822 A1 | 6/1992 | (EP) | ................................... 572/45 X |
| 0487823 A2 | 6/1992 | (EP) | ................................... 372/45 X |
| 6-37355 | 2/1994 | (JP) | ................................... 372/43 X |
| 8-56054 | 2/1996 | (JP) | ................................... 372/43 X |

OTHER PUBLICATIONS

F. Jaim et al., "Modeling of Optical Gain in InGaN and $In^xN-In_yGa_{1-y}N$ Quantum–Well Lasers", IEEE Journal of Quantum Electronics, US, IEEE Inc. New York, vol. 32, No. 5, May 1, 1996, pp. 1996, pp. 859–864.

M. Kniessel et al., "XP–000742888 Characteriztion of AlGaInN diode lasers with mirrors from chemically assisted ion beam etching", Applied Physics Letters, US, American Institute of Physics, vol. 72, No. 13, Mar. 30, 1998, pp. 1539–1541.

Europeans Search Report published May 2, 2001 EP16867–011.

* cited by examiner

*Primary Examiner*—Brian Healy
(74) *Attorney, Agent, or Firm*—Eric J. Robinson; Nixon Paebody LLP

(57) ABSTRACT

A GaN buffer layer and an Si-doped n-type GaN contact layer are formed in this order on a sapphire substrate. An n-type $Al_{0.3}Ga_{0.7}N$ cladding layer, an n-type $Al_{0.25}Ga_{0.75}N$ optical guide layer, a multi-quantum well active layer, in which $Al_{0.2}Ga_{0.8}N$ well layers and $Al_{0.25}Ga_{0.75}N$ barrier layers are alternately stacked, an Mg-doped p-type $Al_{0.25}Ga_{0.75}N$ optical guide layer, a p-type $Al_{0.4}Ga_{0.6}N_{0.98}P_{0.02}$ cladding layer and a p-type GaN contact layer are stacked in this order on an active region on the upper surface of the n-type contact layer.

4 Claims, 11 Drawing Sheets

SEMICONDUCTOR LASER DEVICE

BACKGROUND OF THE INVENTION

The present invention relates to a Group III-V nitride semiconductor laser device, emitting laser light at a short wavelength, which is expected to be applicable to optical information processing, for example.

In recent years, apparatuses for various types of large-capacity optical disks, including a digital versatile disc (DVD) apparatus, have been put into practical use, and yet research and development have been carried on to further increase the storage capacity of an optical disk. As is well known in the art, shortening the oscillation wavelength of laser light for use in reading and writing information is one of the most effective ways to realize an apparatus adapted to read and write information from/onto an optical disk with an even larger capacity. A semiconductor laser device, which is built in a DVD apparatus currently available, is often made of a Group III-V semiconductor compound (typically, AlGaInP). The oscillation wavelength of an AlGaInP semiconductor laser device is 650 nm. Accordingly, in order to implement a semiconductor laser device compatible with a high-density DVD apparatus under development, the laser device should oscillate at an even shorter wavelength by using a Group III-V nitride semiconductor compound.

Hereinafter, a conventional Group III-V nitride semiconductor laser device will be described with reference to FIG. 10.

FIG. 10 illustrates a cross-sectional structure of a conventional Group III-V nitride semiconductor laser device.

Referring to FIG. 10, a GaN buffer layer 102 and an n-type GaN contact layer 103 with a low resistance are formed in this order on a sapphire substrate 101. On an active region of the n-type contact layer 103, an n-type AlGaN cladding layer 104, an n-type GaN optical guide layer 105, a multi-quantum well (MQW) active layer 106, a p-type GaN optical guide layer 107 and a p-type AlGaN cladding layer 108 are stacked in this order. In the MQW active layer 106, plural pairs of $Ga_{1-x}In_xN$ well layers and $Ga_{1-y}In_yN$ barrier layers (where 0<y<x<1) are alternately stacked. The p-type cladding layer 108 includes a ridge stripe portion 108a with a width ranging from about 3 μm to about 10 μm on the upper surface thereof.

A p-type GaN contact layer 109 with a low resistance is formed on the upper surface of the ridge stripe portion 108a of the p-type cladding layer 108. And both side faces of the ridge stripe portion 108a, the upper surface of the cladding layer 108 except for that portion 108a, and the side faces of the multilayer structure formed on the active region are all covered with an insulating film 110.

A striped p-side electrode 111 is formed on the insulating film 110 to come into contact with the p-type contact layer 109. And an n-side electrode 112 is formed on the n-type contact layer 103 beside the active region thereof.

When the n-side electrode 112 is grounded and a predetermined voltage is applied to the p-side electrode 111, the semiconductor laser device with such a structure enters a laser oscillation state at a wavelength in the range from 370 nm to 430 nm. This oscillation wavelength is variable with the composition and thickness of $Ga_{1-x}In_xN$ and $Ga_{1-y}In_yN$ layers forming the MQW active layer 106. Continuous laser oscillation of such a laser device at room temperature or more was already accomplished. Thus, it is expected that such a laser device will be available everywhere in the near future.

However, in the present state of the art, the conventional nitride semiconductor laser device can maintain continuous laser oscillation at no shorter than about 370 nm. In view of the operating principle of the laser device, it is impossible to further shorten the oscillation wavelength thereof.

Generally speaking, to shorten the oscillation wavelength of a semiconductor laser diode, a so-called "wide-gap semiconductor" with a larger energy gap, which is also termed "band gap", may be used as a material for the active layer thereof. In the MQW active layer 106, for example, the In mole fraction x in $Ga_{1-x}In_xN$ may be 0 (i.e., GaN may be used instead) or AlGaN, containing Al with a larger energy gap, may be used. In either case, a shorter wavelength is attained for the device.

In a semiconductor laser device with a double heterostructure adapted to confine carriers and produced light within the active layer thereof, the cladding layers thereof should be made of a semiconductor with an even larger energy gap than that of the active layer thereof.

In general, in order to actually operate such a laser device at room temperature or more, the cladding layers thereof should have an energy gap, which is larger than that of the active layer thereof by at least about 0.4 eV. Since the energy gap of AlGaN semiconductors is changeable within a broad range from 3.4 eV to 6.2 eV, cladding layers with a larger energy gap can be formed. However, if the composition of an AlGaN semiconductor is changed to have a larger energy gap, it is harder to turn the conductivity type of the semiconductor into p-type by doping the semiconductor with a p-type dopant. This is because a thermal activation efficiency of holes decreases in such a case. Accordingly, in the prior art, even if the AlGaN semiconductor is doped with a p-type dopant, the Al mole fraction in AlGaN is at most 0.2 (i.e., a mixed crystal $Al_{0.2}Ga_{0.8}N$) and the energy gap thereof is at most about 4.0 eV.

As described above, in the conventional Group III-V nitride semiconductor laser device, the energy gap of the p-type semiconductor layer thereof can be no greater than about 4.0 eV.

Moreover, when crystals with a relatively large Al mole fraction are stacked over crystals with a relatively small Al mole fraction, strain is caused between crystals of these two types, because the lattice constants thereof are different from each other. Accordingly, if semiconductor crystals with a large Al mole fraction are grown to form a cladding layer until the thickness thereof reaches a required value of 1 μm or more, then the semiconductor crystals are likely to crack. As a result, the characteristics and the reliability of the laser device with such a cladding layer deteriorate.

SUMMARY OF THE INVENTION

An object of the present invention is (a) providing a semiconductor laser device that can oscillate continuously even in the ultraviolet region.

Another object of the present invention is (b) providing a semiconductor laser device with improved reliability.

The present inventors analyzed from different angles the reasons why the energy gap of a p-type Group III-V nitride semiconductor (e.g., a p-type AlGaN semiconductor, in particular) can be no higher than about 4.0 eV. As a result, we arrived at the following conclusion.

FIG. 11 illustrates respective energy levels of p-type gallium nitride (GaN) and p-type aluminum nitride (AlN). In FIG. 11, the ordinates represent the energy of electrons. As shown in FIG. 11, an acceptor level Ea is formed by magnesium (Mg), which is a p-type dopant, above the respective valence bands Ev of GaN and AlN. Mg is generally regarded as an acceptor that can be activated most easily, because the energy level difference between Mg and a nitride semiconductor is the smallest. Thus, Mg is used widely as a p-type dopant.

However, the acceptor level of Mg is located at a relatively deep level from the edge of the valence band Ev of GaN, i.e., 0.15 eV, and the resulting thermal activation efficiency at room temperature is only about 1%. Accordingly, in order to attain a carrier density of $1\times10^{17}$ cm$^{-3}$ to $1\times10^{18}$ cm$^{-3}$ required for a p-type cladding layer, Mg should be doped at as high a level as about $1\times10^{19}$ cm$^{-3}$ to about $1\times10^{20}$ cm$^{-3}$. The highest doping level of Mg at about $1\times10^{20}$ cm$^{-3}$ is close to a critical value, above which semiconductor crystals of quality cannot be obtained. Thus, once the doping level of Mg exceeds this value, the resultant crystallinity deteriorates noticeably. Therefore, supposing $1\times10^{20}$ cm$^{-3}$ to be a doping level limit, the thermal activation efficiency of the acceptor should be 0.1% or more to attain a carrier density of $1\times10^{17}$ cm$^{-3}$ or more.

On the other hand, comparing the levels of Mg and AlN with each other, the acceptor level Ea of Mg is located at an even deeper level. That is to say, the energy level difference between Mg and AlN further increases to reach as large as about 0.6 eV as shown in FIG. 11. For example, in $Al_yGa_{1-y}N$, if the Al mole fraction y is changed, then the level difference increases substantially linearly from 0.15 eV to 0.6 eV. To set the thermal activation efficiency of the acceptor at 0.1% or more, the energy level difference between the acceptor level Ea and the upper edge Ev of the valence band should be relatively small. Accordingly, the Al mole fraction y cannot be increased.

Because of the foregoing reasons, it is very difficult to shorten the oscillation wavelength of the conventional nitride semiconductor laser device so much as to reach the ultraviolet region. At present, it is generally believed that the oscillation wavelength can be no lower than about 360 nm.

Thus, to attain the object (a) of realizing continuous oscillation in the ultraviolet region, phosphorous or arsenic is added to a p-type semiconductor layer in a nitride semiconductor laser device according to the present invention. In this manner, the energy level difference between the acceptor level and the upper edge of the valence band can be reduced (i.e., the acceptor level can be shallower, so to speak) while the energy gap of the p-type semiconductor layer is kept sufficiently large. Also, to attain the object (b) of improving the reliability, the lattice constant of a pair of semiconductor layers, which are provided to sandwich an active layer in a gallium-containing nitride semiconductor laser device, is substantially matched with that of gallium nitride according to the present invention.

A first exemplary semiconductor laser device according to the present invention includes: a first semiconductor layer formed over a substrate and made of a first nitride semiconductor of a first conductivity type; a second semiconductor layer formed over the first semiconductor layer and made of a second nitride semiconductor, the energy gap of the second nitride semiconductor being smaller than that of the first nitride semiconductor; and a third semiconductor layer formed over the second semiconductor layer and made of a third nitride semiconductor of a second conductivity type, the energy gap of the third nitride semiconductor being larger than that of the second nitride semiconductor. The first or third nitride semiconductor contains phosphorus.

In the first semiconductor laser device, the second semiconductor layer is equivalent to an active layer for producing radiation by recombining the carriers supplied from the first and third semiconductor layers. The first and third semiconductor layers are equivalent to a pair of cladding layers or a pair of optical guide layers for confining carriers and recombination radiation in the active layer. In this structure, since the first or third semiconductor layer contains phosphorus (P), the upper edge of the valence band and the lower edge of the conduction band can be both higher, or shifted upward, while keeping the energy gap large. Accordingly, in either the first or third semiconductor layer that has been doped with an acceptor, the energy level difference between the acceptor level and the upper edge of the valence band thereof can be smaller. In other words, the activation efficiency of holes can be increased in the first or third semiconductor layer. Thus, carriers, supplied from the first or third semiconductor layer, can be confined within the second semiconductor layer (i.e., the active layer) having an energy gap corresponding to so short a wavelength as to reach a ultraviolet region with a lot more certainty. As a result, continuous laser oscillation is realized at so short a wavelength as to reach the ultraviolet region. That is to say, the object (a) described above is achieved.

In one embodiment of the present invention, the first and second conductivity types are preferably n-type and p-type, respectively, and the first and third nitride semiconductors preferably have respective compositions $AlGaN_{1-x}P_x$ and $AlGaN_{1-y}P_y$ (where $0 \leq x \leq y$).

In such an embodiment, since the mole fraction of phosphorus in the p-type third semiconductor layer is larger than that in the n-type first semiconductor layer, the upper edge of the valence band is further shifted upward in the third semiconductor layer. Accordingly, the energy level difference between the acceptor level and the upper edge of the valence band can be further reduced. In addition, the n-type first semiconductor layer is located closer to the substrate under the second semiconductor layer, while the p-type third semiconductor layer is located more distant from the substrate above the second semiconductor layer. Thus, the quality of resultant semiconductor crystals can be improved.

In this particular embodiment, the n-type first semiconductor layer preferably has a composition AlGaN.

In such a case, it is possible to prevent the energy level difference between the donor level and the lower edge of the conduction band from increasing. Accordingly, the oscillation wavelength can be short enough to reach the ultraviolet region.

A second exemplary semiconductor laser device according to the present invention includes: a first semiconductor layer formed over a substrate and made of a first nitride semiconductor of a first conductivity type; a second semiconductor layer formed over the first semiconductor layer and made of a second nitride semiconductor, the energy gap of the second nitride semiconductor being smaller than that of the first nitride semiconductor; and a third semiconductor layer formed over the second semiconductor layer and made of a third nitride semiconductor of a second conductivity type, the energy gap of the third nitride semiconductor being larger than that of the second nitride semiconductor. The first or third nitride semiconductor contains arsenic.

In the second semiconductor laser device, since the first or third semiconductor layer contains arsenic (As), the upper edge of the valence band and the lower edge of the conduction band can be shifted upward while keeping the energy gap large as in the first semiconductor laser device. Accordingly, in either the first or third semiconductor layer that has been doped with an acceptor, the energy level difference between the acceptor level and the upper edge of the valence band thereof can be smaller. In other words, the activation efficiency of holes can be increased in the first or third semiconductor layer. As a result, continuous laser oscillation is realized at so short a wavelength as to reach the ultraviolet region. That is to say, the object (a) described above is achieved.

In one embodiment of the present invention, the first and second conductivity types are preferably n-type and p-type, respectively, and the first and third nitride semiconductors preferably have respective compositions $AlGaN_{1-x}As_x$ and $AlGaN_{1-y}As_y$ (where $0 \leq x \leq y$).

In such an embodiment, since the mole fraction of arsenic in the p-type third semiconductor layer is larger than that in the n-type first semiconductor layer, the upper edge of the valence band is further shifted upward in the third semiconductor layer. Accordingly, the energy level difference between the acceptor level and the upper edge of the valence band can be further reduced.

In this particular embodiment, the n-type first semiconductor layer preferably has a composition AlGaN.

In such a case, it is possible to prevent the energy level difference between the donor level and the lower edge of the conduction band from increasing. Accordingly, the oscillation wavelength can be short enough to reach the ultraviolet region.

A third exemplary semiconductor laser device according to the present invention includes: a first semiconductor layer formed over a substrate and made of a first nitride semiconductor of a first conductivity type; a second semiconductor layer formed over the first semiconductor layer and made of a second nitride semiconductor containing gallium, the energy gap of the second nitride semiconductor being smaller than that of the first nitride semiconductor; and a third semiconductor layer formed over the second semiconductor layer and made of a third nitride semiconductor of a second conductivity type, the energy gap of the third nitride semiconductor being larger than that of the second nitride semiconductor. The first and third nitride semiconductors have such a composition that the lattice constant of the first and third nitride semiconductors is substantially equal to that of gallium nitride.

In the third semiconductor laser device, the first and third nitride semiconductor layers, which are equivalent to a pair of cladding layers or a pair of guide layers, have such a composition that the lattice constant of the first and third nitride semiconductors is substantially equal to that of gallium nitride. Accordingly, no strain results from the difference in lattice constant during the crystal growth. Thus, even when the first or third semiconductor layer is used as a cladding layer that should be relatively thick, the first or third semiconductor layer is less likely to crack. As a result, the quality of the semiconductor crystals can be improved and the long-term reliability of the device can also be improved. That is to say, the object (b) described above is accomplished.

In one embodiment of the first, second or third semiconductor laser device, the energy gap of the first or third nitride semiconductor is preferably 4 eV or more.

In such an embodiment, the laser light can be output at a wavelength short enough to reach the ultraviolet region.

DESCRIPTION OF THE PREFERRED EMBODIMENTS

Embodiment 1

Hereinafter, a semiconductor laser device according to a first exemplary embodiment of the present invention will be described with reference to the accompanying drawings.

Figure 1:
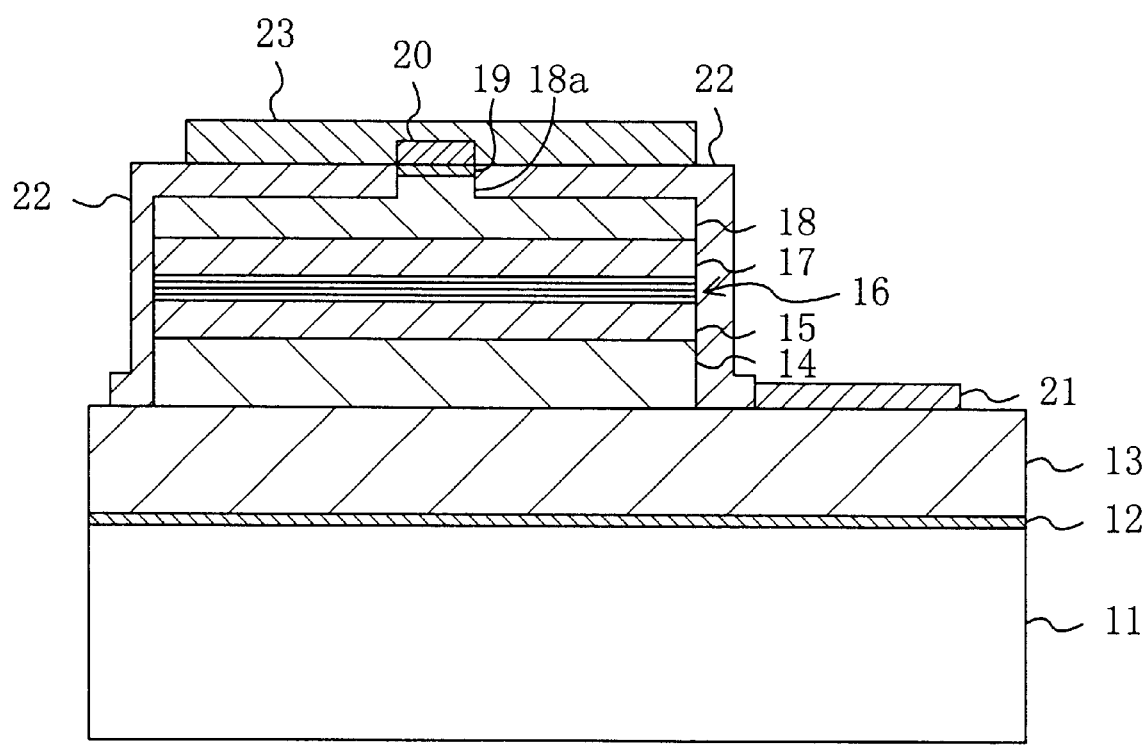
FIG. 1 is a cross-sectional view illustrating a structure of a multi-quantum well nitride semiconductor laser device according to a first embodiment of the present invention.

FIG. 1 illustrates a cross-sectional structure of a multi-quantum well nitride semiconductor laser device of the first embodiment. In the following discussion, the structure of this laser device will be described by way of a method for fabricating respective semiconductor layers forming a double heterojunction.

First, as shown in FIG. 1, a GaN buffer layer 12 is formed by a metalorganic vapor phase epitaxy (MOVPE) process on a substrate 11 made of sapphire with a plane orientation of (0001), for example. The buffer layer 12 is provided for obtaining semiconductor layers with reduced crystal imperfections by compensating for a mismatch in lattice constant between the substrate 11 and nitride semiconductor crystals to be grown over the substrate 11. On the buffer layer 12, an Si-doped n-type GaN contact layer 13 with a low resistance, an n-type $Al_{0.3}Ga_{0.7}N$ cladding layer 14 and an n-type $Al_{0.25}Ga_{0.75}N$ optical guide layer 15 are formed in this order. The cladding layer 14 is used for confining electrons and produced light in an active layer (described below), and the optical guide layer 15 makes it easier to confine the produced light within the active layer.

On the guide layer 15, a multi-quantum well active layer 16, an Mg-doped p-type $Al_{0.25}Ga_{0.75}N$ optical guide layer 17, a p-type $Al_{0.4}Ga_{0.6}N_{0.98}P_{0.02}$ cladding layer 18 and a p-type GaN contact layer 19 with a low resistance are formed in this order. The active layer 16 is formed by alternately stacking plural pairs of $Al_{0.2}Ga_{0.8}N$ well layers and $Al_{0.25}Ga_{0.75}N$ barrier layers one upon the other for producing radiation through the recombination of electrons and holes confined within the layer 16. The guide layer 17 makes it easier to confine the produced light within the active layer 16, and the cladding layer 18 is used for confining holes and produced light in the active layer 16. In this manner, a plurality of epitaxial layers are formed to have double heterojunctions by vertically sandwiching the active layer 16 between the n- and p-type cladding layers 14 and 18 with an energy gap larger than that of the active layer 16. After these epitaxial layers have been formed, the p-type contact layer 19 and the p-type cladding layer 18 are selectively dry-etched to leave respective portions in the active region, thereby forming a ridge stripe portion 18a. The upper half of the ridge stripe portion 18a is formed out of the p-type contact layer 19 with a width of about 5 μm.

Then, a p-side electrode 20 is selectively formed on the p-type contact layer 19, i.e., the upper half of the ridge stripe portion 18a, by alternately stacking plural pairs of Ni and Au layers thereon. Thereafter, the respective epitaxial layers are partially dry-etched with the active region thereof masked until the n-type contact layer 13 is exposed, thereby securing a region for forming an n-side electrode on the upper surface of the n-type contact layer 13. And an n-side electrode 21 is selectively formed on the region of the n-type contact layer 13 by alternately stacking plural pairs of Ti and Al layers thereon.

Subsequently, a protective insulating film 22 such as a silicon dioxide film is formed to cover both side faces of the ridge stripe portion 18a of the p-type cladding layer 18 and both side faces of the multilayer structure in the active region.

Finally, an interconnecting electrode 23 is formed on the protective insulating film 22 as well as over the p-side electrode 20, and electrically connected to the p-side electrode 20, thereby completing the nitride semiconductor laser device shown in FIG. 1.

Hereinafter, the operation and the operating characteristics of the semiconductor laser device having such a structure will be described with reference to the accompanying drawings.

The effective energy gap of the multi-quantum well active layer 16 in the semiconductor laser device of this embodiment is about 4 eV. Thus, when the n-side electrode 21 is grounded and a predetermined voltage is applied to the p-side electrode 20, holes and electrons are injected into the active layer 16 from the p- and n-side electrodes 20 and 21, respectively. As a result, an optical gain is acquired in the active layer 16 and the laser oscillation is caused at a wavelength of about 310 nm.

Figure 2:
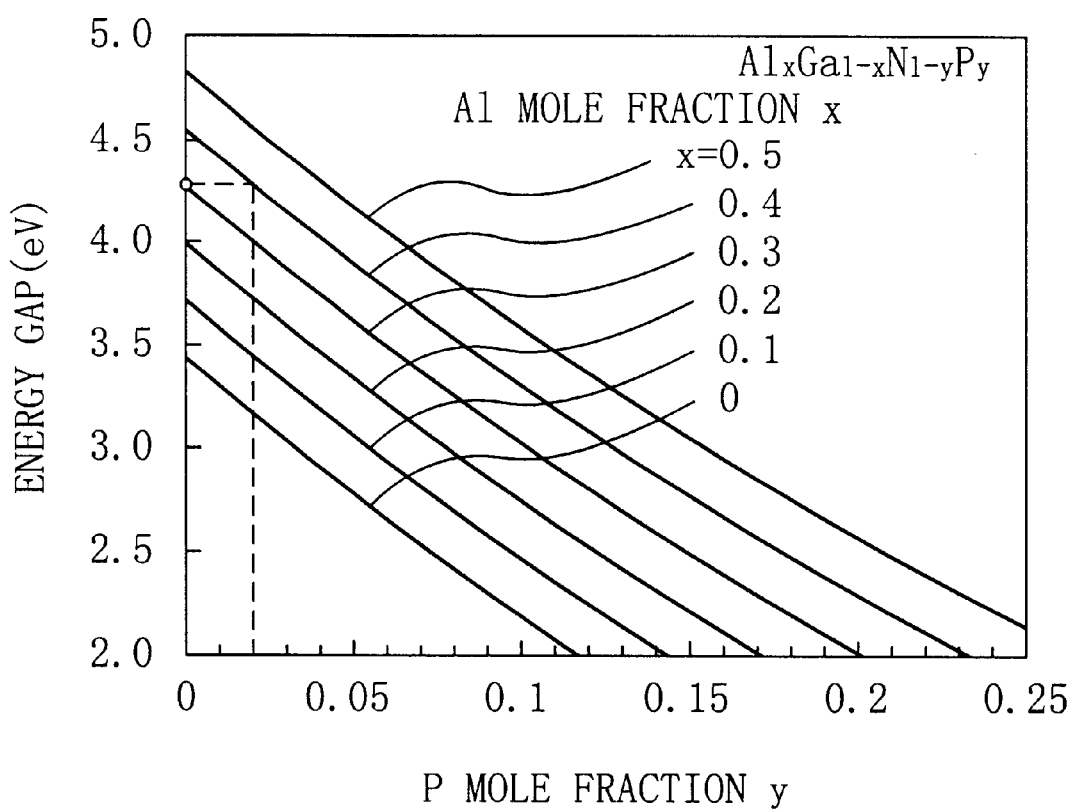
FIG. 2 is a graph illustrating relationships between the respective mole fractions of Al and P in a nitride semiconductor AlGaNP for the semiconductor laser device of the first embodiment and associated energy gaps.

FIG. 2 illustrates relationships between the respective mole fractions of Al and P in a nitride semiconductor AlGaNP for the semiconductor laser device of the first embodiment and associated energy gaps. As shown in FIG. 2, the n-type cladding layer 14, in which the mole fractions of Al and P are 0.3 and 0, respectively, has an energy gap of about 4.4 eV. The p-type cladding layer 18, in which the mole fractions of Al and P are 0.4 and 0.02, respectively, also has an energy gap of about 4.4 eV. Accordingly, electrons and holes can be confined within the active layer 16 with certainty.

Figure 3:
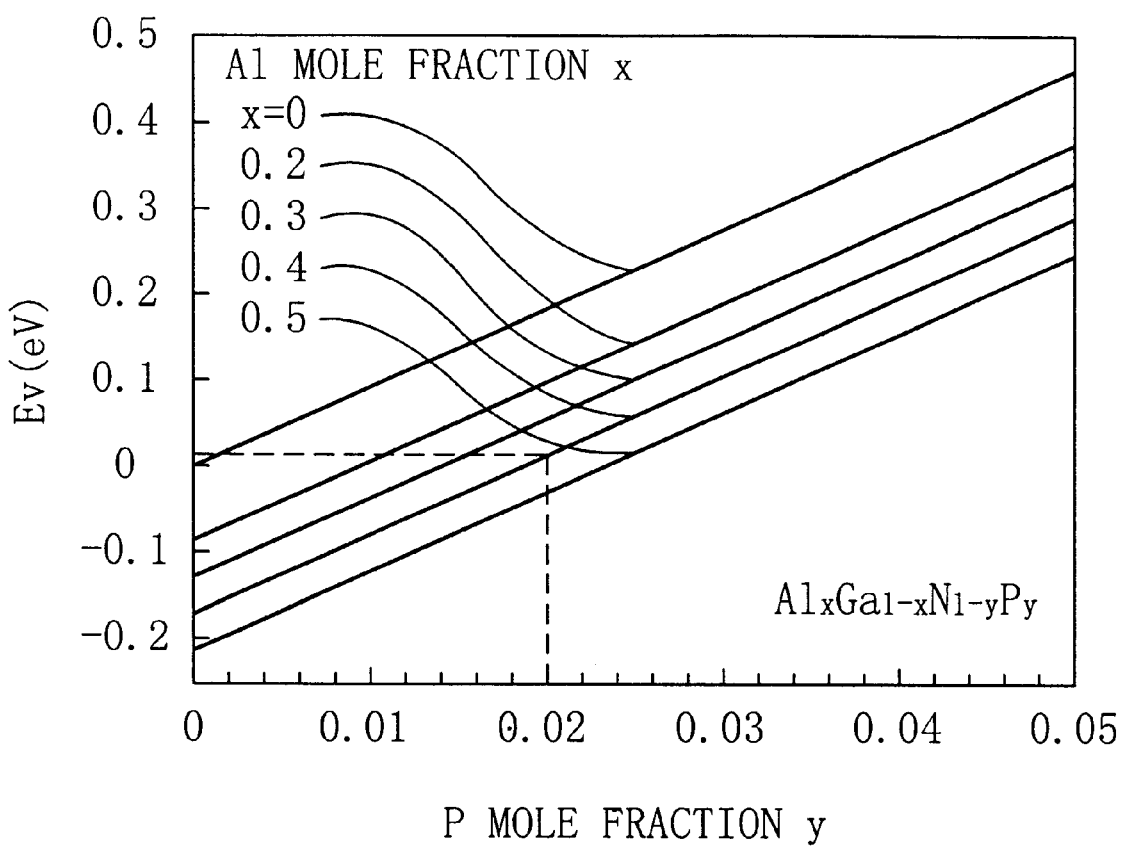
FIG. 3 is a graph illustrating relationships between the respective mole fractions of Al and P in a nitride semiconductor AlGaNP for the semiconductor laser device of the first embodiment and the energy levels Ev at the upper edge of the valence band.

FIG. 3 illustrates relationships between the respective mole fractions of Al and P in a nitride semiconductor AlGaNP for the semiconductor laser device of the first embodiment and energy levels Ev at the upper edge of the valence band. The results shown in FIG. 3 are derived based on the Vegard's law. In FIG. 3, 0 eV on the axis of ordinates indicates that the mole fractions x and y of Al and P are both zero, i.e., the energy Ev at the upper edge of the valence band of GaN crystals.

As shown in FIG. 3, when the mole fractions of Al and P are 0.4 and 0, respectively, the energy Ev at the upper edge of the valence band is lower than that of GaN mixed crystals by 0.17 eV. That is to say, the acceptor level gets deeper by 0.17 eV. However, in this embodiment, the p-type cladding layer 18 has a composition $Al_{0.4}Ga_{0.6}N_{0.98}P_{0.02}$, in which the mole fractions of Al and P are 0.4 and 0.02, respectively. Accordingly, the energy Ev at the upper edge of the valence band is almost equal to that of the GaN mixed crystals. Rather, the acceptor level gets a little shallower.

Next, it will be briefly described what type of dopant should be introduced into the n- and p-type cladding layers 14 and 18 at what levels. The doping level and the type of the dopant are of top importance, because these cladding layers 14 and 18 are characteristic of the present invention.

The n-type cladding layer 14 should be doped with silicon (Si) as an n-type dopant. In such a case, a carrier density of about $1 \times 10^{18}$ cm$^{-3}$ is attained.

Also, the p-type cladding layer 18, made of a Group III-V nitride semiconductor, is doped with a Group V element, i.e., phosphorus (P). Accordingly, the acceptor level Ea formed by Mg, which is a p-type dopant, can be about 0.15 eV, which is approximately equal to that of GaN, as shown in FIG. 3.

As can be understood from FIG. 3, the larger the mole fraction of Al in the Group III-V nitride semiconductor, the lower the energy Ev at the upper edge of the valence band. In contrast, according to the present invention, by adding phosphorus, the energy Ev at the upper edge of the valence band can be shifted upward, or increased, while maintaining an energy gap at 4 eV or more as shown in FIGS. 2 and 3. As a result, the activation efficiency of the acceptor increases.

In general, in accordance with simple expression, the thermal activation efficiency p of holes is given by:

$$p = \exp\{-(Ea-Ev)/kT\}$$

where Ea is acceptor level, Ev is energy at the upper edge of the valence band, k is Boltzmann's constant and T is absolute temperature. In actuality, the activation efficiency cannot be derived so simply as this equation. However, it is still true that as the energy level difference between the acceptor level Ea and the energy Ev at the upper edge of the valence band increases, the activation efficiency p of the p-type dopant drastically decreases.

As shown in FIG. 3, the larger the mole fraction x of Al, the lower the energy Ev at the upper edge of the valence band. And the impurity level, which is the energy level difference between the acceptor level Ea and the energy Ev at the upper edge of the valence band, increases and the activation efficiency p decreases.

Thus, according to the present invention, phosphorus is introduced into the Group III-V nitride semiconductor as an additional Group V element and the mole fraction y of phosphorus is optimized, thereby shifting upward, or increasing, the energy Ev at the upper edge of the valence band. As a result, the energy level difference (Ea-Ev) between the acceptor level Ea and the energy Ev at the upper edge of the valence band can be reduced.

Nevertheless, if P is added to the nitride semiconductor AlGaN, then the energy gap also decreases as shown in FIG. 2. Accordingly, in order to attain a predetermined energy gap, the mole fraction of Al should be large.

As can be understood, the mole fraction of Al in the Group III-V nitride semiconductor including Al is increased in this embodiment, thereby maintaining a predetermined energy gap. In addition, P is also added to the composition, thereby reducing the energy level difference between the acceptor level Ea and the energy Ev at the upper edge of the valence band. As a result, the thermal activation efficiency of the acceptor increases and the p-type cladding layer 18 can effectively contribute to the operation of the active layer 16 with an energy gap corresponding to the oscillation wavelength in the ultraviolet region.

It should be noted that if P is added, then the donor level gets deeper to the contrary and the activation efficiency of the donor decreases to a certain degree. Accordingly, to obtain an oscillation wavelength in the ultraviolet region, the mole fraction of P in the n-type cladding layer 14 should be as small as possible. Also, AlGaN, to which no P has been added, may also be used.

However, if the oscillation wavelength is relatively long, or the device emits radiation approximately in the blue region, then the n-type cladding layer 14 should be made of quaternary mixed crystals like the p-type cladding layer 18. In such a case, laser device can be fabricated more easily because the crystal grower can be operated more smoothly. Accordingly, the composition of the n-type cladding layer 14 may be determined depending on the oscillation wavelength of the laser light, i.e., depending on the intended application thereof.

As described above, by adding phosphorus (P) to the composition of a Group III-V nitride semiconductor including aluminum (Al), a shallow acceptor level can be formed while maintaining a predetermined energy gap. Accordingly, if mixed crystals of p-type AlGaNP are used for the p-type cladding layer of a double heterojunction semiconductor laser device, then a semiconductor laser device can oscillate continuously in a short wavelength region reaching so far as the ultraviolet region.

It should be noted that phosphorus (P) may also be added to the compositions of the n- and p-type optical guide layers 15 and 17 with a larger energy gap than that of the active layer 16 (to the p-type optical guide layer 17, in particular).

Embodiment 2

Next, a semiconductor laser device according to a second exemplary embodiment of the present invention will be described with reference to the accompanying drawings.

Figure 4:
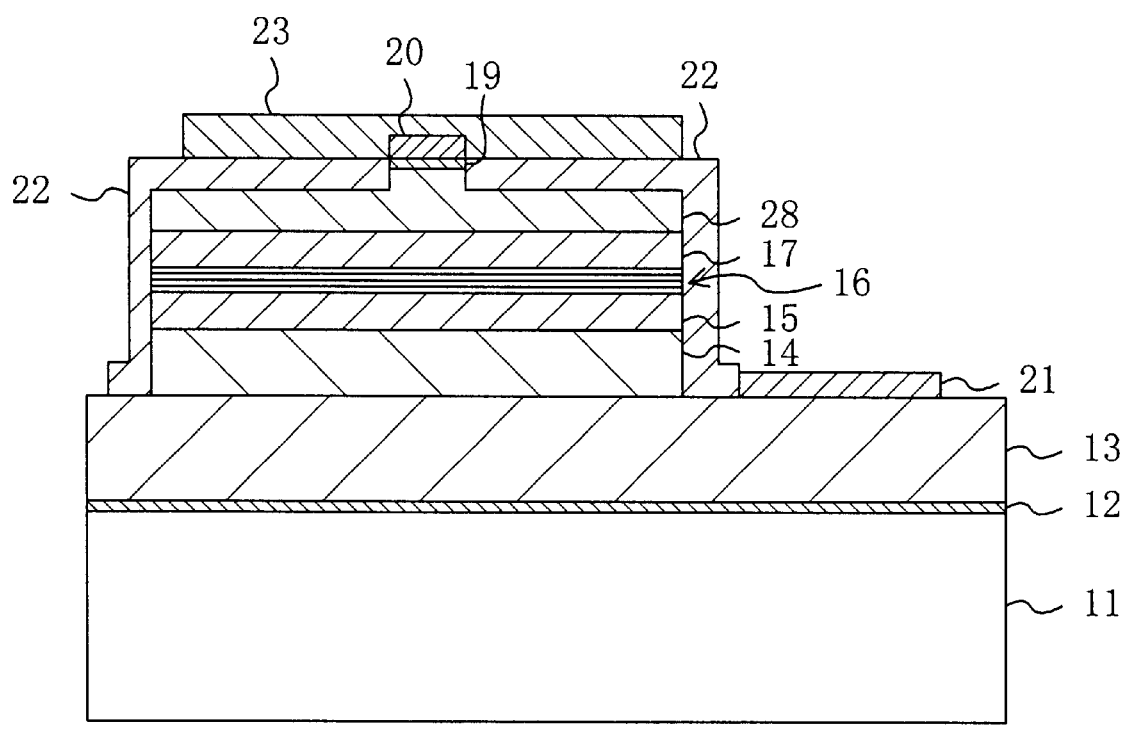
FIG. 4 is a cross-sectional view illustrating a structure of a multi-quantum well nitride semiconductor laser device according to a second embodiment of the present invention.

FIG. 4 illustrates a cross-sectional structure of a multi-quantum well nitride semiconductor laser device of the second embodiment. In FIG. 4, the same components as those illustrated in FIG. 1 are identified by the same reference numerals and the description thereof will be omitted herein.

In this embodiment, a p-type cladding layer 28 shown in FIG. 4 is an Mg-doped p-type $Al_{0.4}Ga_{0.6}N_{0.98}As_{0.02}$ semiconductor layer.

Figure 5:
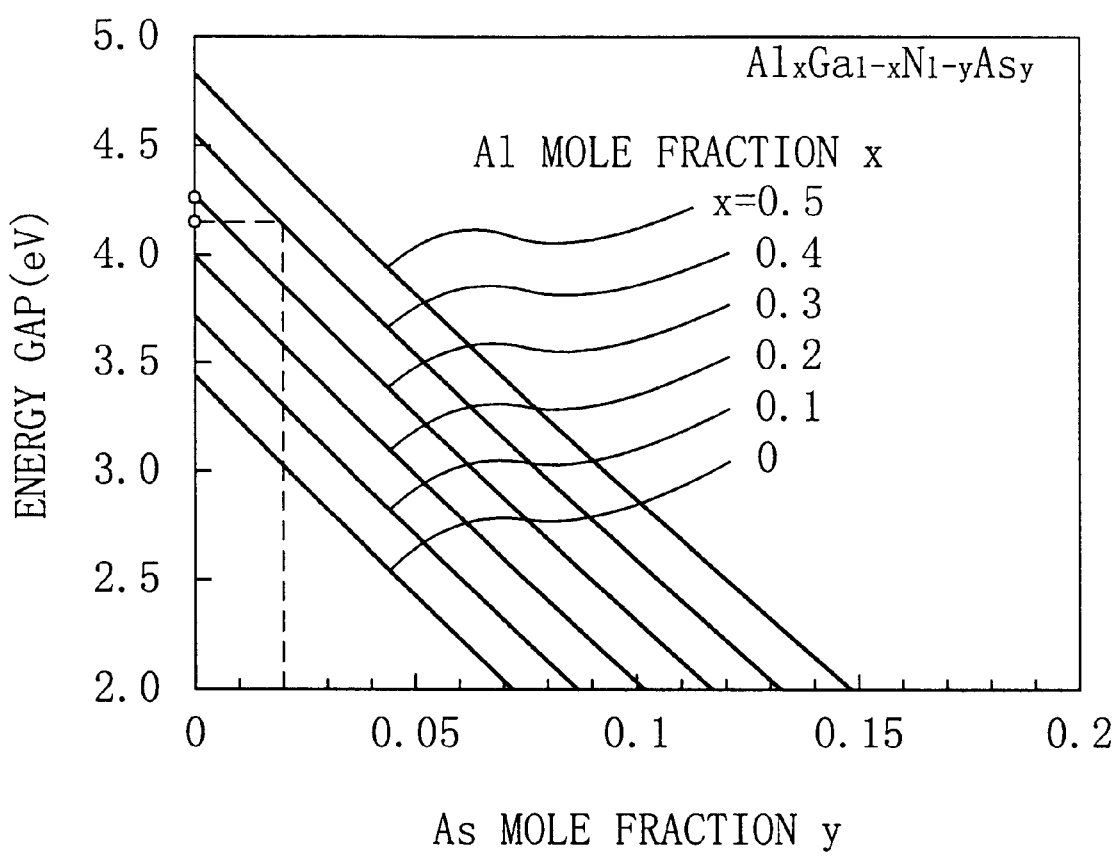
FIG. 5 is a graph illustrating relationships between the respective mole fractions of Al and As in a nitride semiconductor AlGaNAs for the semiconductor laser device of the second embodiment and associated energy gaps.
Figure 6:
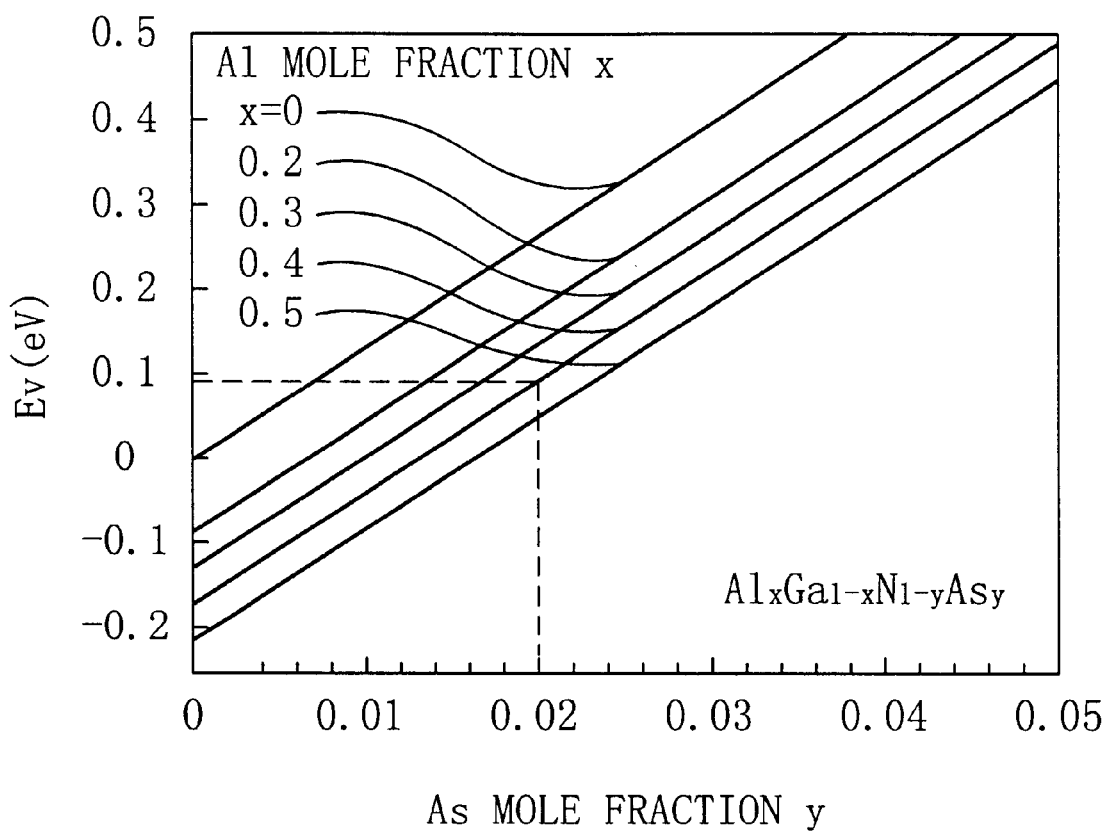
FIG. 6 is a graph illustrating relationships between the respective mole fractions of Al and As in a nitride semiconductor AlGaNAs for the semiconductor laser device of the second embodiment and the energy levels Ev at the upper edge of the valence band.

FIG. 5 illustrates relationships between the respective mole fractions of Al and As in a nitride semiconductor AlGaNAs for the semiconductor laser device of the second embodiment and associated energy gaps. FIG. 6 illustrates relationships between the respective mole fractions of Al and As in the nitride semiconductor AlGaNAs for the semiconductor laser device of the second embodiment and associated energy levels Ev at the upper edge of the valence band. The results shown in FIG. 6 are derived based on the Vegard's law.

As shown in FIG. 5, the p-type cladding layer 28, in which the mole fractions of Al and As are 0.4 and 0.02, respectively, has an energy gap of about 4.3 eV. Accordingly, electrons and holes can be confined within the active layer 16 with certainty.

Further, as shown in FIG. 6, the energy level difference (Ea–Ev) between the acceptor level Ea and the energy Ev at the upper edge of the valence band is smaller as compared with a nitride semiconductor where the mole fraction of As is zero.

Thus, as in the first embodiment, by adding arsenic (As) to the composition of a Group III-V nitride semiconductor including aluminum (Al) and by setting the mole fraction of Al at a relatively high value of about 0.4, a shallower acceptor level can be formed, as compared with a nitride semiconductor to which no As is added, while maintaining a predetermined energy gap. Accordingly, if mixed crystals of p-type AlGaNAs are used for the p-type cladding layer of the double heterojunction semiconductor laser device, then the semiconductor laser device can oscillate continuously in a short wavelength region reaching so far as the ultraviolet region.

It should be noted that if As is added, then the activation efficiency of the donor decreases to a certain degree. Accordingly, to obtain an oscillation wavelength in the ultraviolet region, the mole fraction of As in the n-type cladding layer 14 should be as small as possible. Also, AlGaN, to which no As is added, is preferably used.

However, if the oscillation wavelength is relatively long, or the device emits radiation approximately in the blue region, then the n-type cladding layer 14 should be made be quaternary mixed crystals like the p-type cladding layer 28. In such a case, a laser device can be fabricated more easily. Accordingly, the composition of the n-type cladding layer 14 may be determined depending on the intended application of the device.

It should be noted that arsenic (As) may also be added to the compositions of the n- and p-type optical guide layers 15 and 17 with a larger energy gap than that of the active layer 16 (to the p-type optical guide layer 17, in particular).

Embodiment 3

Next, a semiconductor laser device according to a third exemplary embodiment of the present invention will be described with reference to the accompanying drawings.

Figure 7:
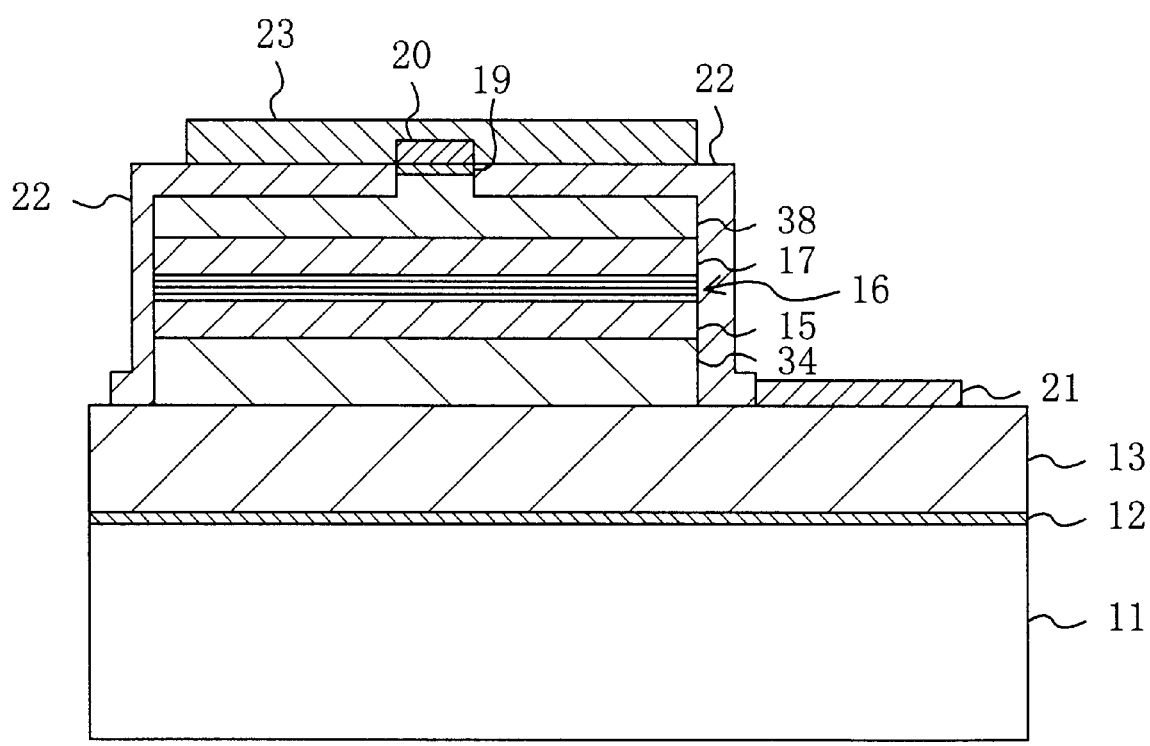
FIG. 7 is a cross-sectional view illustrating a structure of a multi-quantum well nitride semiconductor laser device according to a third embodiment of the present invention.

FIG. 7 illustrates a cross-sectional structure of a multi-quantum well nitride semiconductor laser device according to a third embodiment of the present invention. In FIG. 7, the same components as those illustrated in FIG. 1 are identified by the same reference numerals and the description thereof will be omitted herein.

In this embodiment, an n-type cladding layer 34 shown in FIG. 7 is an Si-doped n-type $Al_{0.4}Ga_{0.6}N_{0.98}P_{0.02}$ semiconductor layer, while a p-type cladding layer 38 is an Mg-doped p-type $Al_{0.4}Ga_{0.6}N_{0.98}P_{0.02}$ semiconductor layer.

As in the first embodiment, the effective energy gap of the multi-quantum well active layer 16 is about 4 eV. Thus, the oscillation wavelength of the laser light, output from the active layer 16, is about 310 nm.

As shown in FIG. 2, the energy gaps of the n- and the p-type cladding layers 34 and 38 are both about 4.4 eV. Thus, electrons and holes can be confined within the active layer 16 with certainty.

In the foregoing first and second embodiments, exemplary structures for increasing the activation efficiency of the acceptor in the p-type semiconductor layer for the Group III-V nitride semiconductor laser device containing Al have been described. In this embodiment, an exemplary structure for improving the quality of semiconductor crystals in a Group III-V nitride semiconductor laser device containing Al will be described.

As described above, if a cladding layer, which needs to be relatively thick, contains a lot of Al in a Group III-V nitride semiconductor containing Al to increase the energy gap thereof, then the cladding layer is more likely to crack. Accordingly, the larger the mole fraction of Al, the more restricted the thickness of the cladding layer itself so as not to cause cracking.

Cracking is caused because the larger the mole fraction of Al, the larger the difference in lattice constant between the Group III-V nitride semiconductor containing Al and gallium nitride (GaN), which is a typical semiconductor among various Group III-V nitride semiconductors.

Figure 8:
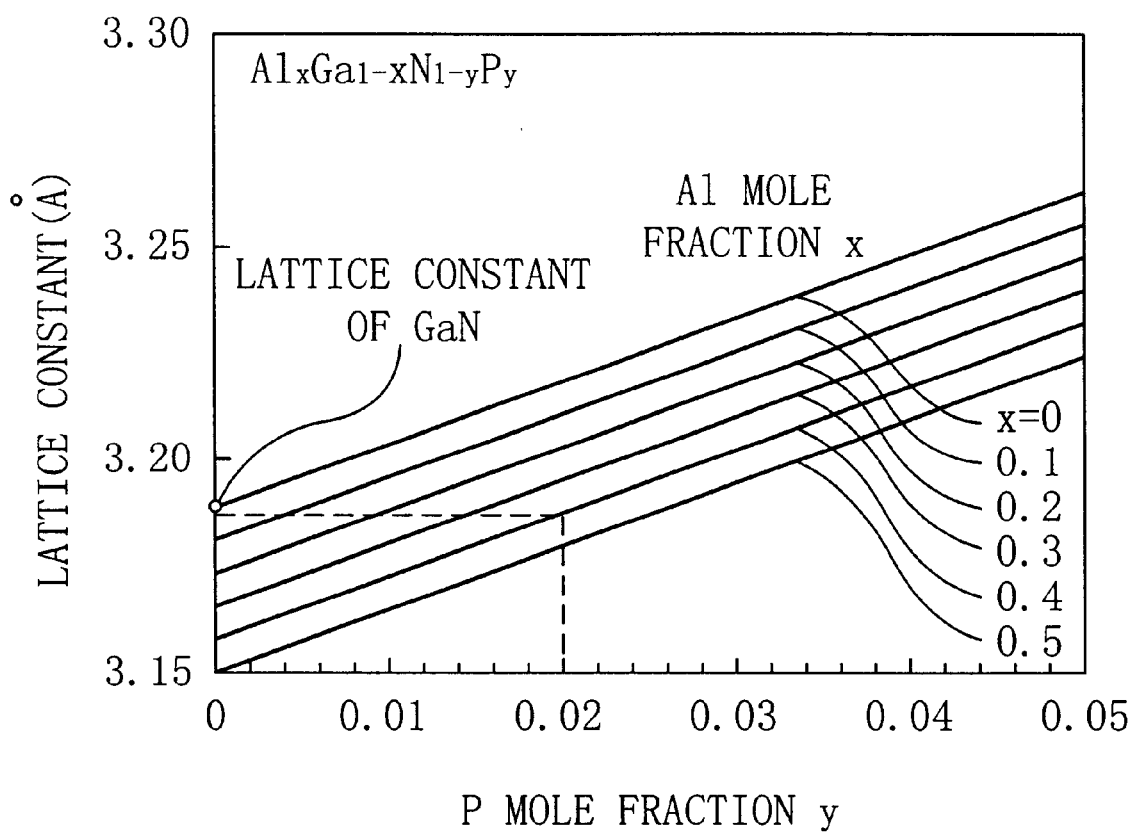
FIG. 8 is a graph illustrating relationships between the respective mole fractions of Al and P in a nitride semiconductor AlGaNP for the semiconductor laser device of the third embodiment and associated lattice constants.

FIG. 8 illustrates relationships between the respective mole fractions of Al and P in a nitride semiconductor AlGaNP for the semiconductor laser device of the third embodiment and associated lattice constants. In FIG. 8, the open circle on the axis of ordinates indicates a lattice constant of a compound in which the mole fractions x and y of the Al and P are both zero, i.e., the lattice constant of GaN crystals.

As shown in FIG. 8, since the mole fractions of Al and P in the cladding layers 34 and 38 of this semiconductor laser device are 0.4 and 0.02, respectively, the lattice constant of these cladding layers 34 and 38 is substantially equal to 3.19 Å, which is the lattice constant of GaN crystals. Accordingly, since no strain is caused between the n-type contact layer 13 and the n-type cladding layer 34 or between the p-type contact layer 19 and the p-type cladding layer 38 during the crystal growth, lattice defects like cracking can be suppressed. As a result, semiconductor crystals of quality can be obtained.

As can be understood, a cladding layer, which should have a large energy gap, is made of high-quality semiconductor crystals with an extremely small number of lattice defects in a nitride semiconductor laser device made of semiconductors with a wide energy gap. Thus, a high-performance semiconductor laser device, operating at a short wavelength, with a low threshold current and for a sufficiently long time, is realized.

Figure 9:
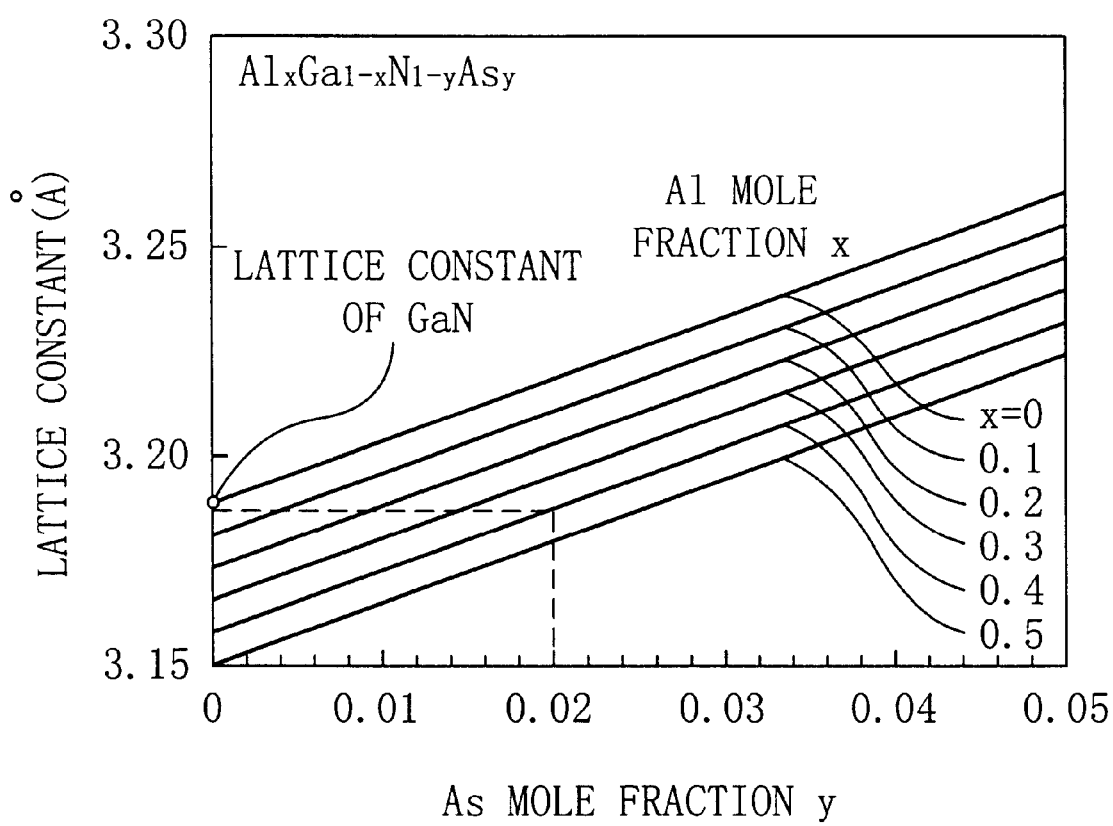
FIG. 9 is a graph illustrating relationships between the respective mole fractions of Al and As in a nitride semiconductor AlGaNAs for the semiconductor laser device of the third embodiment and associated lattice constants.
Figure 10:
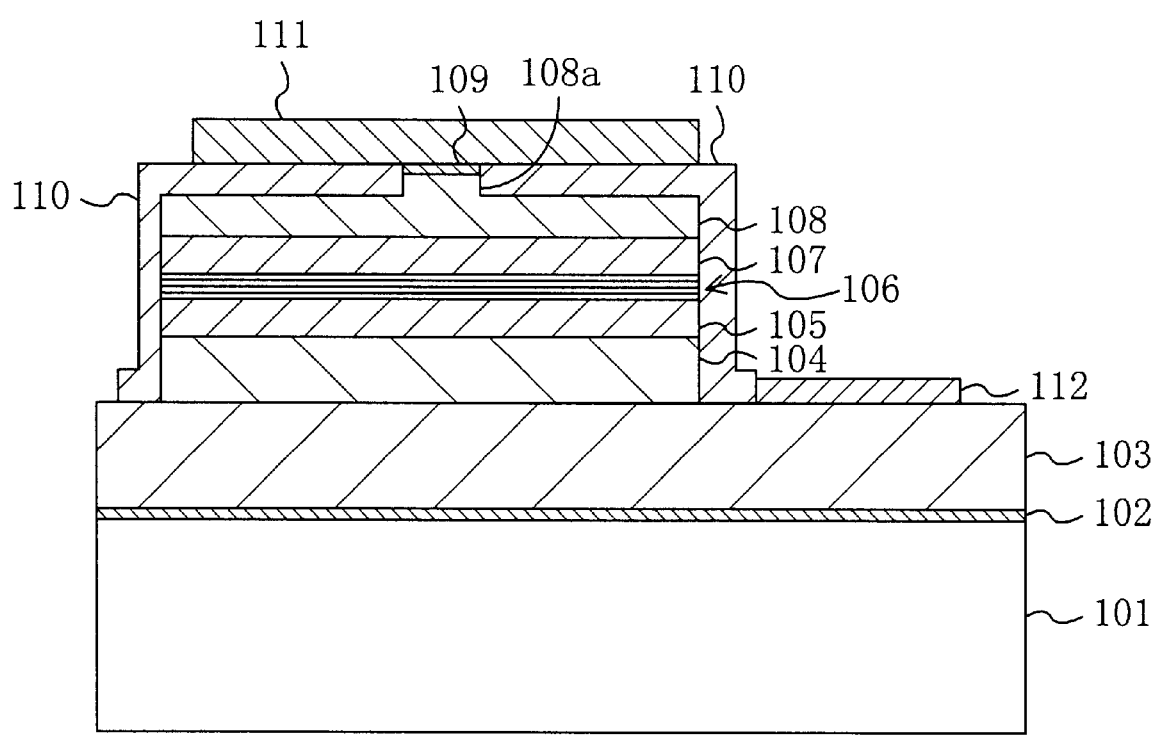
FIG. 10 is a cross-sectional view illustrating a structure of a conventional multi-quantum well nitride semiconductor laser device.
Figure 11:
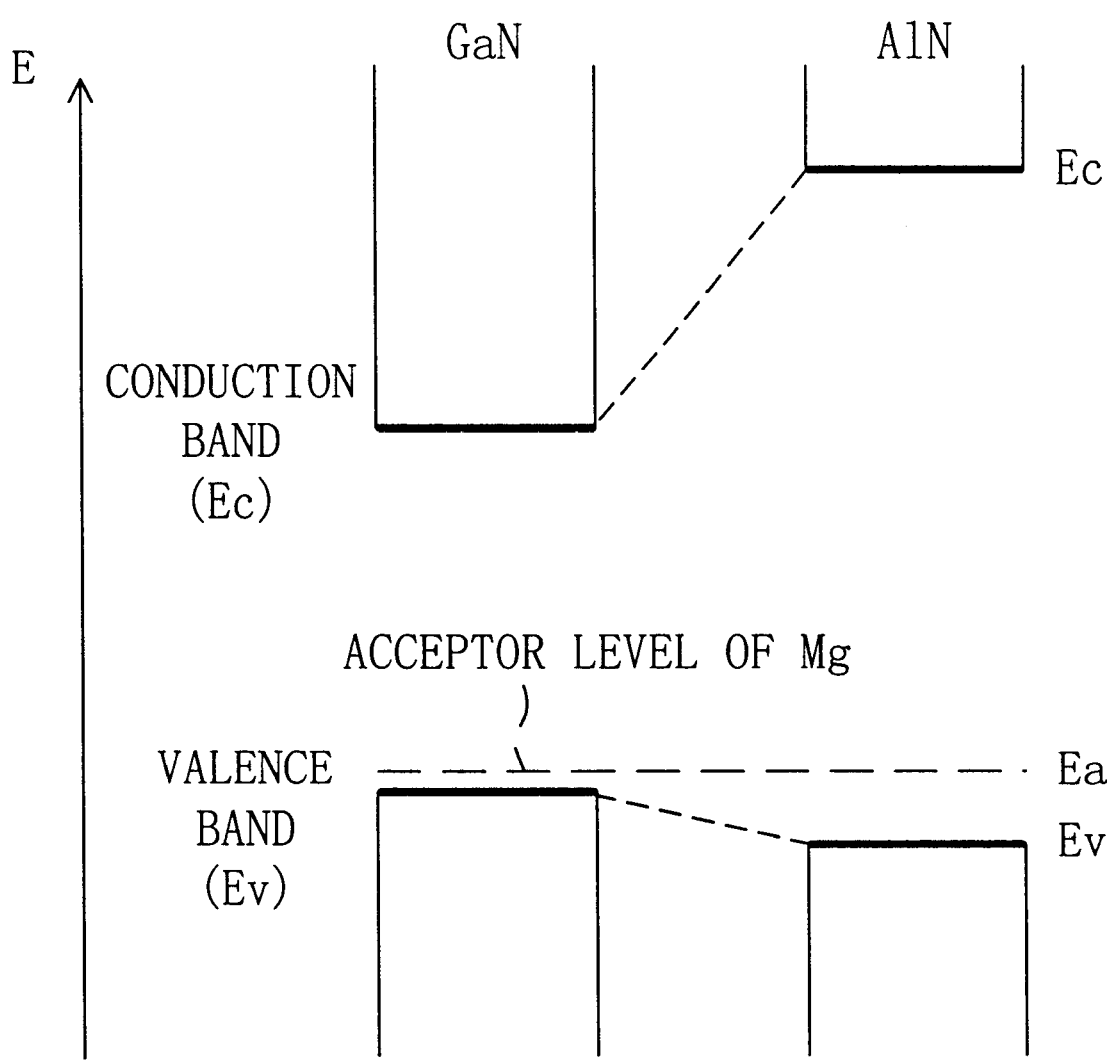
FIG. 11 is an energy band diagram illustrating respective energy levels of p-type gallium nitride and p-type aluminum nitride.

FIG. 9 illustrates relationships between the respective mole fractions of Al and As in a nitride semiconductor AlGaNAs for the semiconductor laser device of the third embodiment and associated lattice constants. As shown in FIG. 9, even if the n- and p-type cladding layers 34 and 38 shown in FIG. 7 are n-type $Al_{0.4}Ga_{0.6}N_{0.98}As_{0.02}$ semiconductor layer and p-type $Al_{0.4}Ga_{0.6}N_{0.98}As_{0.02}$ semiconductor layer, respectively, the lattice constants of these cladding layers 34 and 38 can be substantially equal to that of GaN crystals.

What is claimed is:

1. A semiconductor laser device comprising:
   a first semiconductor layer formed over a substrate and made of a first nitride semiconductor of a first conductivity type;
   a second semiconductor layer formed over the first semiconductor layer and made of a second nitride semiconductor, the energy gap of the second nitride semiconductor being smaller than that of the first nitride semiconductor; and
   a third semiconductor layer formed over the second semiconductor layer and made of a third nitride semiconductor of a second conductivity type, the energy gap of the third nitride semiconductor being larger than that of the second nitride semiconductor,
   wherein the first or third nitride semiconductor contains phosphorus,
   wherein the first and second conductivity types are n-type and p-type, respectively, and
   wherein the first and third nitride semiconductors have respective compositions $AlGaN_{1-x}P_x$ and $AlGaN_{1-y}P_y$ (where $0 \leq x \leq y$).

2. The device of claim 1, wherein the first and second conductivity types are n-type and p-type, respectively, and
   wherein the first and third nitride semiconductors have respective compositions $AlGaN_{1-x}P_x$ and $AlGaN_{1-y}P_y$ (where $0 \leq x \leq y$).

3. A semiconductor laser device comprising:
   a first semiconductor layer formed over a substrate and made of a first nitride semiconductor of a first conductivity type;
   a second semiconductor layer formed over the first semiconductor layer and made of a second nitride semiconductor, the energy gap of the second nitride semiconductor being smaller than that of the first nitride semiconductor; and
   a third semiconductor layer formed over the second semiconductor layer and made of a third nitride semiconductor of a second conductivity type, the energy gap of the third nitride semiconductor being larger than that of the second nitride semiconductor,
   wherein the first or third nitride semiconductor contains arsenic,
   wherein the first and second conductivity types are n-type and p-type, respectively, and
   wherein the first and third nitride semiconductors have respective compositions $AlGaN_{1-x}P_x$ and $AlGaN_{1-y}AS_y$ (where $0 \leq x \leq y$).

4. The device of claim 3, wherein the energy gap of the first or third nitride semiconductor is 4 eV mor more.

* * * * *

UNITED STATES PATENT AND TRADEMARK OFFICE
CERTIFICATE OF CORRECTION

PATENT NO. : 6,324,200 B1
DATED : November 27, 2001
INVENTOR(S) : Satoshi Kamiyama et al.

It is certified that error appears in the above-identified patent and that said Letters Patent is hereby corrected as shown below:

<u>Title page,</u>
Item [56], U.S. PATENT DOCUMENTS, delete "5,231,102  7/1993 Baker et al…….. 514/312"

<u>Column 12,</u>
Line 2, replace claim 1 with the following:

1. A semiconductor laser device comprising:
a first semiconductor layer formed over a substrate and
made of a first nitride semiconductor of a first conductivity type;
a second semiconductor layer formed over the first semiconductor
layer and made of a second nitride semiconductor,
the energy gap of the second nitride semiconductor being smaller than
that of the first nitride semiconductor; and
a third semiconductor layer formed over the second semiconductor
layer and made of a third nitride semiconductor of a second conductivity
type, the energy gap of the third nitride semiconductor being larger than that
of the second nitride semiconductor,
wherein the first or third nitride semiconductor contains phosphorus,
wherein the first and second conductivity types are n-type and p-type,
respectively, and
wherein the first and third nitride semiconductors have respective
compositions $AlGaN_{1-x}P_x$ and $AlGaN_{1-y}P_y$ [(where $0\underline{<}x\underline{<}y$ )] <u>(where $0\leq x\leq y$)</u>.

UNITED STATES PATENT AND TRADEMARK OFFICE
CERTIFICATE OF CORRECTION

PATENT NO.    : 6,324,200 B1
DATED         : November 27, 2001
INVENTOR(S)   : Satoshi Kamiyama et al.

It is certified that error appears in the above-identified patent and that said Letters Patent is hereby corrected as shown below:

<u>Column 12 (cont.),</u>
Line 28, replace claims with the following:

3. A semiconductor laser device comprising:
a first semiconductor layer formed over a substrate and
made of a first nitride semiconductor of a first conductivity type;
a second semiconductor layer formed over the first semiconductor
layer and made of a second nitride semiconductor,
the energy gap of the second nitride semiconductor being smaller than
that of the first nitride semiconductor; and
a third semiconductor layer formed over the second semiconductor
layer and made of a third nitride semiconductor of a second conductivity
type, the energy gap of the third nitride semiconductor being larger than that
of the second nitride semiconductor,
wherein the first or third nitride semiconductor contains arsenic,
wherein the first and second conductivity types are n-type and p-type,
respectively, and
wherein the first and third nitride semiconductors have respective
compositions [ $AlGaN_{1-x}P_x$ and $AlGa_{1-y}AS_y$ (where <u>0<x<y</u>) ] <u>$AlGaN_{1-x}As_x$ and $AlGaN_{1-y}As_y$</u>
<u>(where 0≤x≤y)</u>

Signed and Sealed this

Twenty-fourth Day of December, 2002

JAMES E. ROGAN
*Director of the United States Patent and Trademark Office*